(12) United States Patent
Ramaswamy et al.

(10) Patent No.: US 7,968,406 B2
(45) Date of Patent: Jun. 28, 2011

(54) MEMORY CELLS, METHODS OF FORMING DIELECTRIC MATERIALS, AND METHODS OF FORMING MEMORY CELLS

(75) Inventors: D. V. Nirmal Ramaswamy, Boise, ID (US); Noel Rocklein, Boise, ID (US); Kyu S. Min, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 204 days.

(21) Appl. No.: 12/351,099

(22) Filed: Jan. 9, 2009

(65) Prior Publication Data

US 2010/0176432 A1   Jul. 15, 2010

(51) Int. Cl.
*H01L 21/336* (2006.01)

(52) U.S. Cl. ............ 438/257; 257/E21.18; 257/E21.68; 257/E21.681

(58) Field of Classification Search .......... 438/257–267; 257/314–320, E21.179, E21.18, E21.68, 257/E21.681
See application file for complete search history.

(56) References Cited

U.S. PATENT DOCUMENTS

| | | | |
|---|---|---|---|
| 6,297,095 B1 | 10/2001 | Muralidhar et al. | |
| 6,310,376 B1 | 10/2001 | Ueda et al. | |
| 6,461,909 B1 | 10/2002 | Marsh et al. | |
| 6,737,313 B1 | 5/2004 | Marsh et al. | |
| 6,933,218 B1 | 8/2005 | Lee et al. | |
| 7,005,697 B2 | 2/2006 | Batra | |
| 7,112,485 B2 | 9/2006 | Vaartstra | |
| 7,199,023 B2 | 4/2007 | Ahn et al. | |
| 7,400,012 B2 | 7/2008 | Bhattacharyya | |
| 7,575,978 B2 | 8/2009 | Kraus et al. | |
| 2001/0015453 A1* | 8/2001 | Agarwal | 257/310 |
| 2002/0153579 A1* | 10/2002 | Yamamoto | 257/412 |
| 2006/0261441 A1 | 11/2006 | Marsh et al. | |
| 2007/0048953 A1 | 3/2007 | Gealy et al. | |
| 2007/0102742 A1* | 5/2007 | Kil et al. | 257/295 |
| 2007/0132010 A1 | 6/2007 | Bhattacharyya | |

(Continued)

FOREIGN PATENT DOCUMENTS

WO   PCTUS2009067387   7/2010

OTHER PUBLICATIONS

Conley, Jr., J. F. et al., "Atomic Layer Deposition of Hafnium Oxide Using Anhydrous Hafnium Nitrate", Electrochemical and Solid-State Letters, 5 (5) C57-059 (2002).

(Continued)

*Primary Examiner* — Brook Kebede
(74) *Attorney, Agent, or Firm* — Wells St. John P.S.

(57) ABSTRACT

Some embodiments include memory cells. The memory cells may include a tunnel dielectric material, a charge-retaining region over the tunnel dielectric material, crystalline ultra-high k dielectric material over the charge-retaining region, and a control gate material over the crystalline ultra-high k dielectric material. Additionally, the memory cells may include an amorphous region between the charge-retaining region and the crystalline ultra-high k dielectric material, and/or may include an amorphous region between the crystalline ultra-high k dielectric material and the control gate material. Some embodiments include methods of forming memory cells which contain an amorphous region between a charge-retaining region and a crystalline ultra-high k dielectric material, and/or which contain an amorphous region between a crystalline ultra-high k dielectric material and a control gate material.

14 Claims, 11 Drawing Sheets

U.S. PATENT DOCUMENTS

| | | | |
|---|---|---|---|
| 2008/0002330 A1* | 1/2008 | Park | 361/311 |
| 2008/0150003 A1 | 6/2008 | Chen et al. | |
| 2008/0274615 A1 | 11/2008 | Vaartstra | |
| 2009/0097320 A1 | 4/2009 | Min et al. | |
| 2009/0267129 A1* | 10/2009 | Kim et al. | 257/315 |
| 2009/0283817 A1 | 11/2009 | Krishnamohan et al. | |

OTHER PUBLICATIONS

Aarik, Jaan, et al., "Phase transformations in hafnium dioxide thin films grown by atomic layer deposition at high temperatures", Applied Surface Science 173 (2001) 15-21.

Aarik, Jaan, et al., "Influence of substrate temperature on atomic layer growth and properties of HfO2 thin films", Thin Solid Films 340 (1999) 110-116.

Hirano, T. et al., "High Performance nMOSFET with HfSix/HfO2 Gate Stack by Low Temperature Process", Semiconductor Technology Development Group, Semiconductor Solutions Network Company, Sony Corporation, 2005, IEEE, 4 pages.

Alshareef, H.N. et al., "Thermally Stable N-Metal Gate MOSFETs Using La-Incorporated HfSiO Dielectric", 2006 Symposium on VLSI Technology Digest of Technical Papers, IEEE, 2 pages.

Takahashi, Kensuke et al., "High Mobility Dual Metal Gate MOS Transistors with High-k Gate Dielectrics", Extended Abstracts of the 2004 International Conference on Solid State Devices and Materials, Tokyo, 2004, pp. 22-23.

Akasaka, Y. et al., "Material Selection for the Metal Gate/High-k Transistors", Extended Abstracts of the 2004 International Conference on Solid State Devices and Materials, Tokyo, 2004, pp. 196-197.

\* cited by examiner

MEMORY CELLS, METHODS OF FORMING DIELECTRIC MATERIALS, AND METHODS OF FORMING MEMORY CELLS

TECHNICAL FIELD

Memory cells, methods of forming dielectric materials, and methods of forming memory cells.

BACKGROUND

Memory devices provide data storage for electronic systems. One type of memory is a nonvolatile memory known as flash memory. A flash memory is a type of EEPROM (electrically-erasable programmable read-only memory) that may be erased and reprogrammed in blocks. Many modern personal computers have BIOS stored on a flash memory chip. Such a BIOS is sometimes called a flash BIOS. Flash memory is also popular in wireless electronic devices because it enables the manufacturer to support new communication protocols as they become standardized, and to provide the ability to remotely upgrade the devices for enhanced features.

NAND is a basic architecture of flash memory. A NAND cell unit comprises at least one select gate coupled in series to a serial combination of memory cells (with the serial combination being commonly referred to as a NAND string).

A typical flash memory comprises a memory array that includes a large number of nonvolatile memory cells arranged in row and column fashion. The cells are usually grouped into blocks. Each of the cells within a block may be electrically programmed by charging a charge-retaining material (for instance, polysilicon of a floating gate, or charge trapping material, such as silicon nitride and/or nanodots). The charge may be removed from the charge-retaining material by a block erase operation. Data is stored in a cell as charge in the charge-retaining material.

Individual memory cells may comprise charge-blocking dielectric material over the charge-retaining material, and a control gate material over the charge-blocking dielectric material. The charge-blocking dielectric material may comprise crystalline material having a dielectric constant greater than or equal to about 15. Materials with dielectric constants greater than or equal to 15 may be referred to as ultra-high k dielectric materials.

A problem with conventional memory cells can be that the crystalline ultra-high k dielectric materials utilized as charge-blocking materials may have grain boundaries extending therein. Such grain boundaries may enable contaminating materials to leak into, or even entirely through, the charge-blocking materials. Also, grain boundaries may contain a high density of defects which may provide leakage paths, and/or may provide unwanted trapped charge.

It is desired to develop new memory cells which avoid the above-discussed problem, and to develop methods of forming such memory cells.

BRIEF DESCRIPTION OF THE DRAWINGS

FIG. 1 is a simplified block diagram of a memory system in accordance with an embodiment.

DETAILED DESCRIPTION OF THE ILLUSTRATED EMBODIMENTS

FIG. 1 is a simplified block diagram of a memory system 500, according to an embodiment. Memory system 500 includes an integrated circuit flash memory device 502 (e.g., a NAND memory device), that includes an array of floating-gate memory cells 504, an address decoder 506, row access circuitry 508, column access circuitry 510, control circuitry 512, input/output (I/O) circuitry 514, and an address buffer 516. Memory system 500 includes an external microprocessor 520, or other memory controller, electrically connected to memory device 502 for memory accessing as part of an electronic system. The memory device 502 receives control signals from the processor 520 over a control link 522. The memory cells are used to store data that is accessed via a data (DQ) link 524. Address signals are received via an address link 526, and are decoded at address decoder 506 to access the memory array 504. Address buffer circuit 516 latches the address signals. The memory cells may be accessed in response to the control signals and the address signals.

Figure 2:
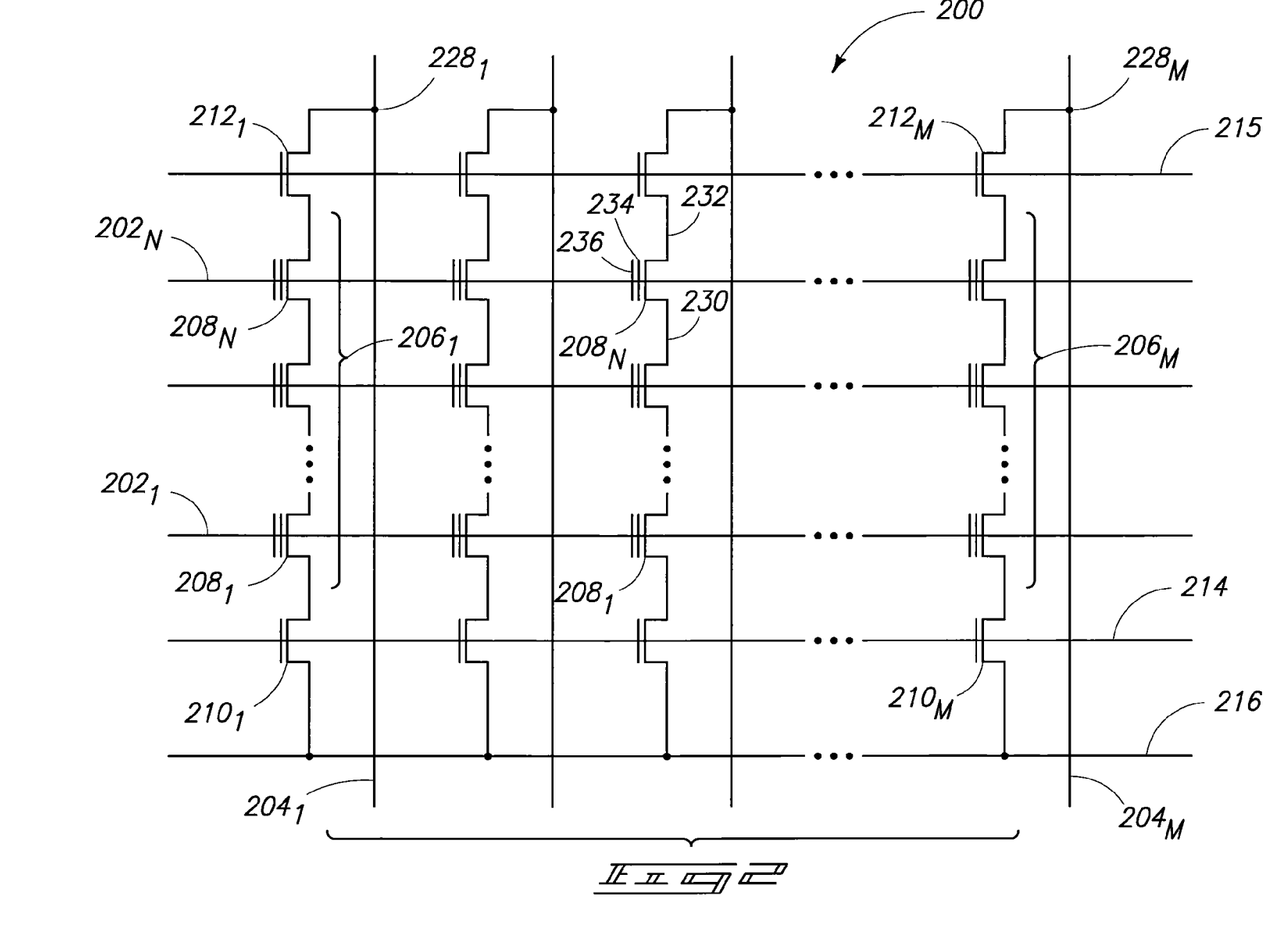
FIG. 2 is a schematic of a NAND memory array in accordance with an embodiment.

FIG. 2 is a schematic of a NAND memory array 200. Such may be a portion of the memory array 504 of FIG. 1. Memory array 200 includes wordlines $202_1$ to $202_N$, and intersecting local bitlines $204_1$ to $204_M$. The number of wordlines 202 and the number of bitlines 204 may be each some power of two, for example, 256 wordlines and 4,096 bitlines. The local bitlines 204 may be coupled to global bitlines (not shown) in a many-to-one relationship.

Memory array 200 includes NAND strings $206_1$ to $206_M$. Each NAND string includes charge-retaining transistors $208_1$ to $208_N$. The charge-retaining transistors are located at intersections of wordlines 202 and local bitlines 204. The charge-retaining transistors 208 represent nonvolatile memory cells for storage of data. The charge-retaining transistors 208 of each NAND string 206 are connected in series source to drain between a source select gate 210 and a drain select gate 212. Each source select gate 210 is located at an intersection of a local bitline 204 and a source select line 214, while each drain select gate 212 is located at an intersection of a local bitline 204 and a drain select line 215.

A source of each source select gate 210 is connected to a common source line 216. The drain of each source select gate 210 is connected to the source of the first charge-retaining transistor 208 of the corresponding NAND string 206. For example, the drain of source select gate $210_1$ is connected to the source of charge-retaining transistor $208_1$ of the corresponding NAND string $206_1$. The source select gates 210 are connected to source select line 214.

The drain of each drain select gate 212 is connected to a local bitline 204 for the corresponding NAND string at a drain contact 228. For example, the drain of drain select gate $212_1$ is connected to the local bitline $204_1$ for the corresponding NAND string $206_1$ at drain contact $228_1$. The source of each drain select gate 212 is connected to the drain of the last charge-retaining transistor 208 of the corresponding NAND string 206. For example, the source of drain select gate $212_1$ is connected to the drain of charge-retaining transistor $208_N$ of the corresponding NAND string $206_1$.

Charge-retaining transistors 208 may be, for example, floating gate transistors or charge trapping transistors. Each of the charge-retaining transistors includes a source 230, a drain 232, a charge-retaining gate 234, and a control gate 236. Charge-retaining transistors 208 have their control gates 236 coupled to a wordline 202. A column of the charge-retaining transistors 208 are those NAND strings 206 coupled to a given local bitline 204. A row of the charge-retaining transistors 208 are those transistors commonly coupled to a given wordline 202.

In some embodiments, a charge-retaining transistor comprises a vertical stack having crystalline ultra-high k dielectric material between charge-retaining material and control gate material; with the vertical stack also containing amorphous material between the crystalline ultra-high k dielectric material and the charge-retaining material and/or between the crystalline ultra-high k dielectric material and the control gate material material. The term "ultra-high-k dielectric material" means dielectric material having a dielectric constant (k) greater than or equal to 15. The charge-retaining transistor may be a nonvolatile memory cell.

Figure 3:
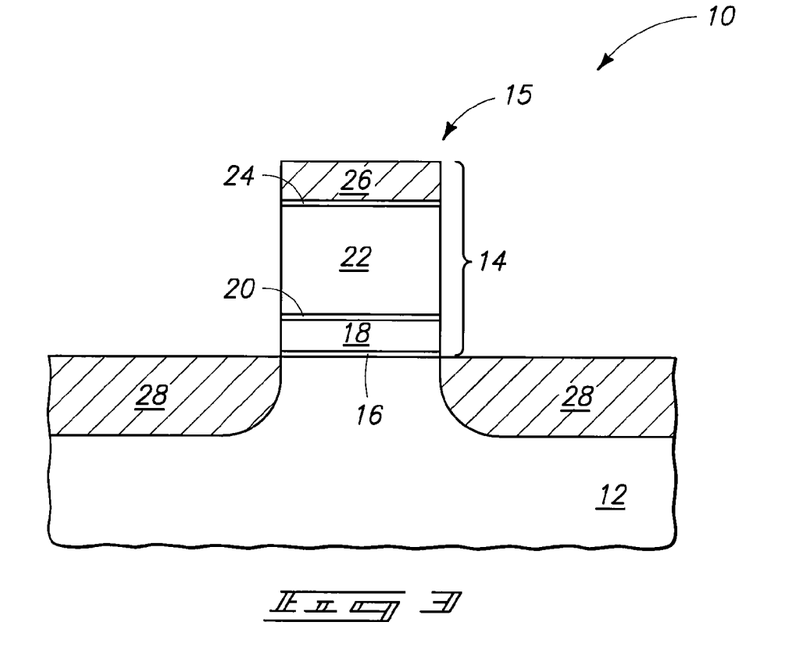
FIG. 3 is a diagrammatic, cross-sectional view of a portion of a semiconductor construction illustrating an example embodiment of a memory cell.

FIG. 3 shows a semiconductor construction 10 that comprises an example memory cell 15.

The semiconductor construction comprises a base 12. Base 12 may, for example, comprise, consist essentially of, or consist of monocrystalline silicon lightly-doped with background p-type dopant, and may be referred to as a semiconductor substrate, or as a portion of a semiconductor substrate. The terms "semiconductive substrate," "semiconductor construction" and "semiconductor substrate" mean any construction comprising semiconductive material (for instance silicon and/or germanium), including, but not limited to, bulk semiconductive materials such as a semiconductive wafer (either alone or in assemblies comprising other materials thereon), and semiconductive material layers (either alone or in assemblies comprising other materials). The term "substrate" means any supporting structure, including, but not limited to, the semiconductive substrates described above.

A gate stack 14 is supported by base 12. The gate stack comprises, in ascending order from the substrate, a tunnel dielectric material 16, a charge-retaining region 18, a first amorphous material 20, a charge-blocking region 22, a second amorphous material 24, and a control gate material 26.

The tunnel dielectric material 16, charge-retaining region 18, charge-blocking region 22, and control gate material 26 may comprise conventional materials.

The tunnel dielectric material 16 may, for example, comprise, consist essentially of, or consist of silicon dioxide; and in some embodiments may comprise, consist essentially of, or consist of $HfSiO_x$, where "x" is greater than zero. In some embodiments, the tunnel dielectric may contain multilayers of dielectrics, or graded composition dielectrics.

The charge-retaining region 18 may correspond to a floating gate; and accordingly may comprise, essentially of, or consist of polysilicon. In some embodiments, the charge-retaining region may comprise one or more charge-trapping materials; and may, for example, comprise silicon nitride, and/or nanodots.

The charge-blocking region 22 may comprise one or more dielectric materials. If more than one dielectric material is utilized in the charge-blocking region, the materials may be stacked one atop the other. The charge-blocking region may include one or more crystalline ultra-high k dielectric materials, such as, for example, crystalline hafnium oxide or crystalline zirconium oxide. In some embodiments, the charge blocking region may comprise crystalline material containing one or more of HfO, ZrO, HfSiO, HfSiON, HfON, ZrON, ZrSiO and ZrSiON; where the chemical formulas indicate elements contained in the listed compositions rather than specific stoichiometries of the elements. The ultra-high k dielectric materials may be arranged so that ultra-high k dielectric material is directly against amorphous regions 20 and 24. Thus, in some embodiments the charge-blocking region 22 may comprise only a single ultra-high k dielectric material extending between amorphous regions 20 and 24; and in other embodiments the charge-blocking region may comprise multiple dielectric materials, with ultra-high k dielectric materials being at the top and bottom edges of the charge-blocking region (i.e., at the edges that are directly adjacent amorphous regions 20 and 24). In embodiments in which the charge-blocking region comprises multiple dielectric materials, such materials may be analogous to the materials 50, 52 and 54 of FIGS. 15 and 16. Thus, the charge-blocking region may comprise three layers, with the outer two layers being ultra-high k materials analogous to the materials 50 and 54 of FIGS. 15 and 16; and with the middle layer being low k, intermediate k, high k or ultra-high k material analogous to material 52 of FIGS. 15 and 16.

Control gate material 26 may comprise one or more electrically conductive compositions; and may, for example, comprise, consist essentially of, or consist of one or more of conductively-doped semiconductor material (for instance, conductively-doped silicon, etc.), metal (for instance, tungsten, titanium, etc.), and metal-containing compositions (for instance, metal silicide, metal nitride, etc.).

The first amorphous material 20 may be utilized as a barrier to prevent migration of chemical species between charge-blocking region 22 and charge-retaining region 18; and the second amorphous material 24 may be utilized as a barrier to prevent migration of chemical species between charge-blocking region 22 and control gate material 26. The amorphous regions may be kept thin enough so that the regions do not substantially alter performance of the memory cell relative to the performance that would occur in the absence the amorphous regions. For instance, each of the amorphous regions may be kept to a thickness of less than 30 Å, or even to a thickness of less than 15 Å; and the electrical properties of a memory cell comprising the amorphous regions may be within plus or minus 2.5 percent of the electrical properties of the memory cell lacking the amorphous regions (with example electrical properties being erase time, erase voltage, programming time and programming voltage).

The amorphous regions 20 and 24 may comprise any suitable compositions, or combinations of compositions; and may, for example, comprise, consist essentially of, or consist of one or more compositions selected from the group consisting of SiO, TiO, TaO, TaON, HfO, SiON, AlO, HfAlO, HfSiO, ZrO, ZrSiO, LaO, YO, LaAlO, ZrON, HfSiON, HfN, ZrN, AlN and TiON. The chemical formulas indicate elements contained in the listed compositions rather than specific stoichiometries of the elements. Accordingly, the listed composition AlO may correspond to $Al_2O_3$.

In some embodiments, the amorphous regions 20 and 24 may be the same in composition as one another; and in other embodiments the amorphous regions 20 and 24 may differ from one another in composition.

In some embodiments, one or both of the amorphous regions 20 and 24 may be of a composition that is not reactive with materials immediately adjacent the amorphous region at normal processing temperatures (i.e., at processing temperatures less than or equal to about 1100° C.). Thus, amorphous region 20 may be of a composition that is not reactive with the portion of the charge-retaining material 18 that is immediately adjacent amorphous region 20, and also not reactive with the portion of the charge-blocking region 22 that is immediately adjacent amorphous region 20; and/or amorphous region 24 may be of a composition that is not reactive with the portion of the control gate material 26 that is immediately adjacent amorphous region 24, and also not reactive with the portion of the charge-blocking region 22 that is immediately adjacent the amorphous region 24.

The lack of reactivity of the amorphous regions with the materials immediately adjacent such amorphous regions can preclude undesired chemical modification during thermal processing steps that may be associated with integrated circuit fabrication. Specifically, such lack of reactivity may preclude undesired chemical modification of either the amorphous regions or the materials immediately adjacent the amorphous regions. In some embodiments, the charge-blocking region may comprise material reactive with control gate material, and the amorphous region 24 may preclude an undesired reaction from occurring between the charge-blocking region and the control gate material. In some embodiments, the charge-blocking region may comprise material reactive with material of the charge-retaining region, and the amorphous region 20 may preclude an undesired reaction from occurring between the charge-blocking region and the material of the charge-retaining region.

A memory cell comprising amorphous regions 20 and 24 may have improved performance and stability relative to a memory cell lacking the amorphous regions. For instance, a memory cell comprising crystalline ultra-high k dielectric material (such as, for example, crystalline hafnium oxide, crystalline zirconium oxide, crystalline hafnium oxynitride, crystalline zirconium oxynitride, etc.) directly against either control gate material 26, or charge-retaining region 18, may have grain boundaries (analogous to those shown and described below with reference to FIG. 10) extending into the crystalline ultra-high k dielectric material. Such grain boundaries may permit conductive chemical species to migrate from adjacent material (specifically, control gate material or material of the charge-retaining region) into the ultra-high k dielectric material. The conductive chemical species may modify electrical properties of the ultra-high k dielectric material, and specifically may degrade blocking characteristics of the dielectric material. Such modification of the electrical properties of the dielectric material may change performance characteristics of a memory device to levels outside of desired tolerances, and/or lead to device failure. In contrast, a memory device having amorphous region 20 between the charge-retaining region 18 and the charge-blocking region 22, and having amorphous region 24 between the charge-blocking region and the control gate material 26, will have barriers which prevent migration of chemical species from the charge-retaining material and the control gate material into the charge-blocking region 22.

In some embodiments, amorphous regions 20 and 24 may both consist of aluminum oxide. In such embodiments, the charge-blocking region 22 may comprise one or more crystalline materials selected from the group consisting of HfO, ZrO, HfSiO, HfSiON, HfON, ZrON, ZrSiO and ZrSiON; where the chemical formulas indicate elements contained in the listed compositions rather than specific stoichiometries of the elements. At least one of such crystalline materials may be directly adjacent the amorphous regions 20 and 24. The aluminum oxide of the amorphous regions may then be utilized as a barrier to prevent migration of chemical species into the crystalline materials of the charge-blocking region.

A pair of source/drain regions 28 are on opposing sides of gate stack 14. In the shown embodiment, the source/drain regions are conductively-doped regions of the semiconductor material of base 12. Regions 28 may be either n-type or p-type majority doped.

The nonvolatile memory cell 15 of FIG. 3 may be utilized in any of numerous electrical systems. In some embodiments, the memory cell may be incorporated into a NAND memory array; and specifically may be utilized as one of the charge-retaining transistors 208 of a NAND string of the type described above with reference to FIG. 2.

The nonvolatile memory cell 15 of FIG. 3 is an example embodiment in which amorphous regions (specifically, the regions 20 and 24 of FIG. 3) are provided along both the bottom surface of a charge-blocking region and the upper surface of the charge-blocking region. In other embodiments, only the amorphous region along the bottom surface of the charge-blocking region may be utilized. In yet other embodiments, only the amorphous region along the upper surface of the charge-blocking region may be utilized. Only one of the amorphous regions 20 and 24 may be utilized if, for example, chemical species migration is believed to be primarily problematic along either the bottom surface of the charge-blocking region or the upper surface of the charge-blocking region.

Figure 4:
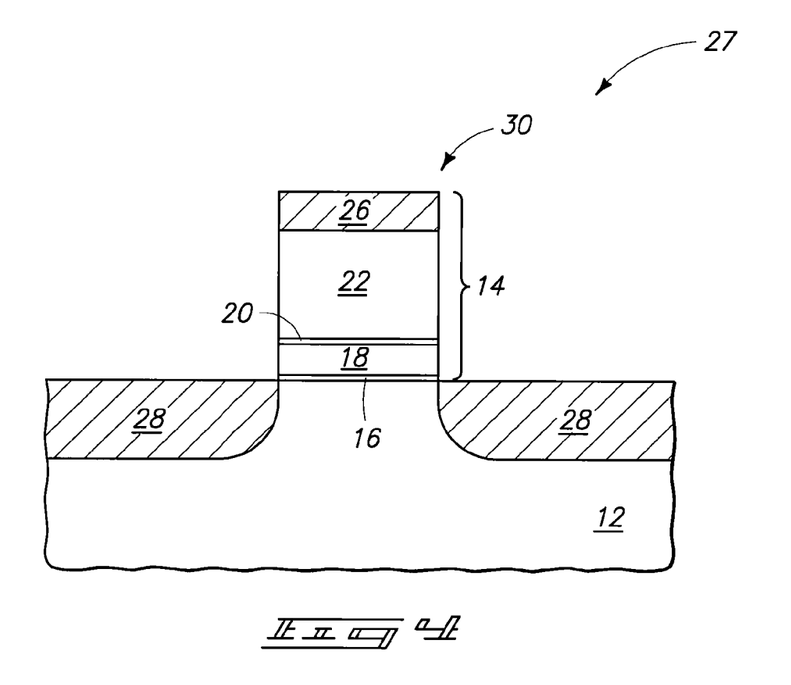
FIG. 4 is a diagrammatic, cross-sectional view of a portion of a semiconductor construction illustrating an example embodiment of a memory cell.
Figure 5:
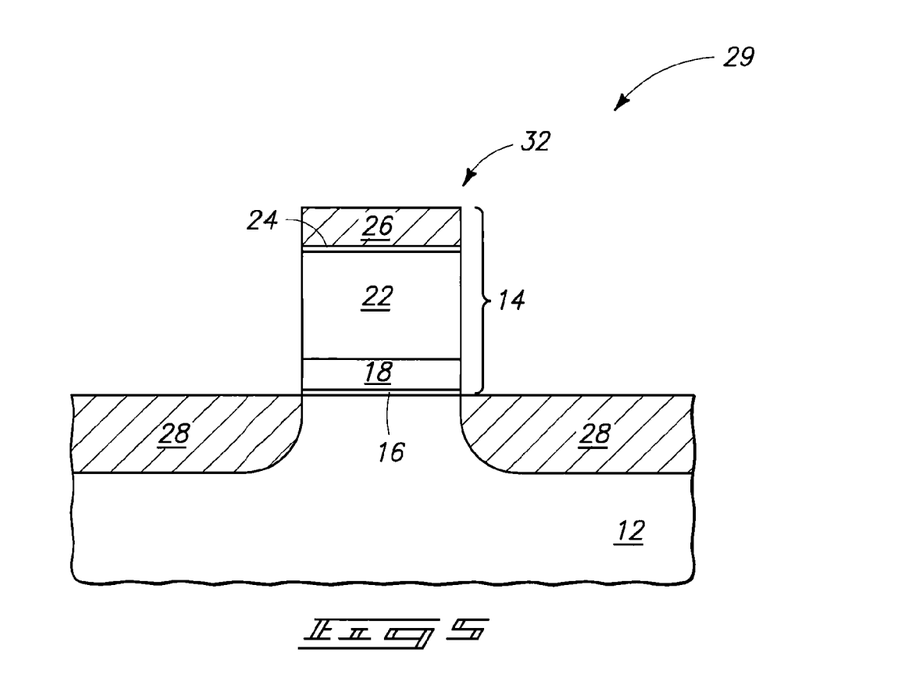
FIG. 5 is a diagrammatic, cross-sectional view of a portion of a semiconductor construction illustrating an example embodiment of a memory cell.

FIGS. 4 and 5 illustrate semiconductor constructions 27 and 29, respectively, comprising example embodiment nonvolatile memory cells 30 and 32, respectively. Similar numbering is utilized to label the regions and materials of FIGS. 4 and 5 as was used above for labeling the regions and materials of FIG. 3. The amorphous regions of memory cells 30 and 32 are formed only along a bottom surface of the charge-blocking region (FIG. 4), or only along the upper surface of the charge-blocking region (FIG. 5).

Figure 6:
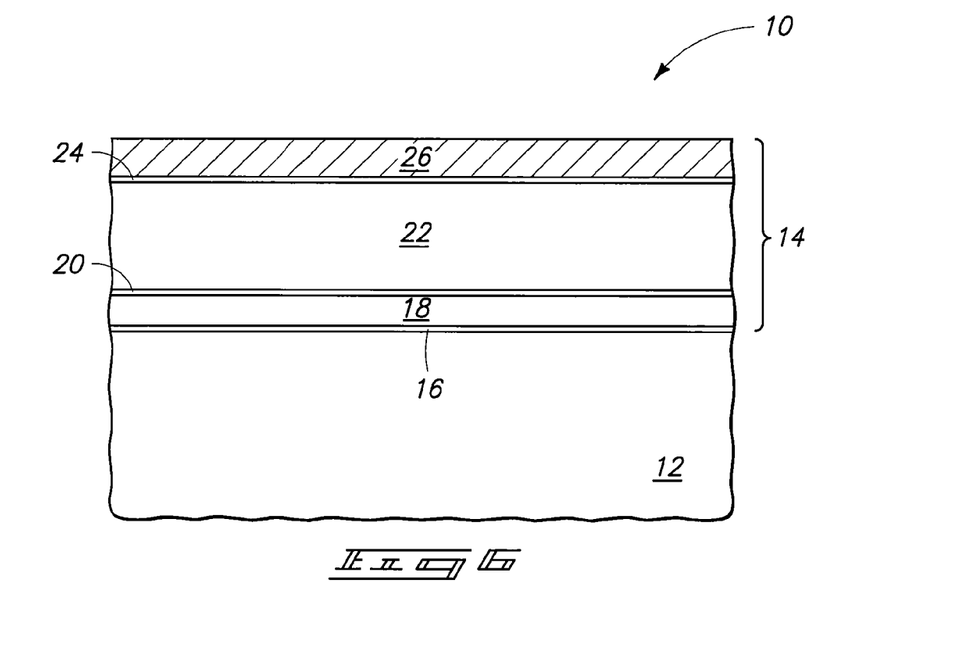
FIGS. 6-8 are diagrammatic, cross-sectional views of a portion of a semiconductor construction illustrating various process stages of an example embodiment method of forming a memory cell.
Figure 7:
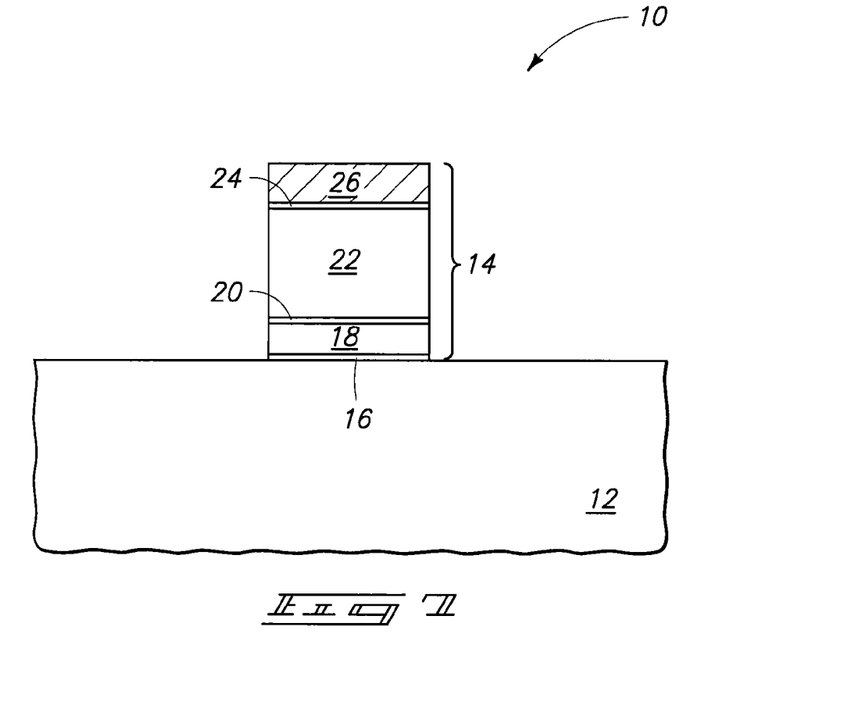
Figure 8:
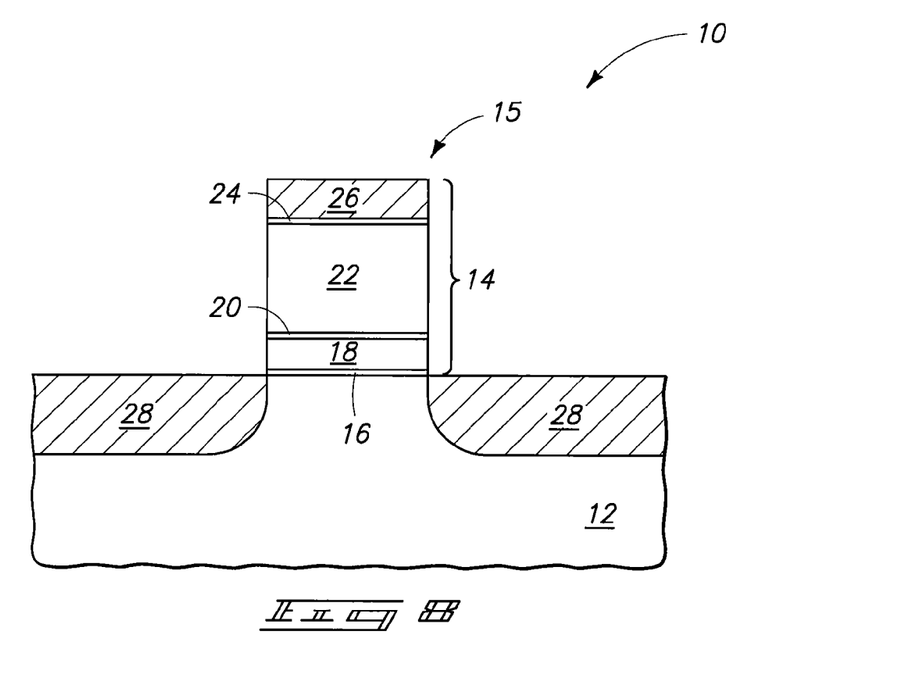

The memory cells of FIGS. 3-5 may be formed utilizing any suitable processing. FIGS. 6-8 illustrate an example method that may be utilized for forming the memory cell 15 of FIG. 3. Similar numbering will be utilized for labeling structures of FIGS. 6-8 as was used above for labeling structures of FIG. 3, where appropriate.

Referring to FIG. 6, construction 10 is shown at a processing stage in which various regions and materials of gate stack 14 are formed to comprise layers extending across substrate 12. Specifically, the tunnel dielectric material 16, charge-retaining region 18, first amorphous region 20, charge-blocking region 22, second amorphous region 24, and control gate material 26 are formed to extend across the substrate 12.

The compositions of the regions and materials may be formed utilizing any suitable processing, including, for example, one or more of atomic layer deposition (ALD), chemical vapor deposition (CVD) and physical vapor deposition (PVD).

In some embodiments, the tunnel dielectric material 16, charge-retaining region 18, first amorphous region 20, charge-blocking region 22, second amorphous region 24, and control gate material 26 may be formed in a single process chamber without breaking vacuum to the chamber. In other embodiments, one or more of the tunnel dielectric material 16, charge-retaining region 18, first amorphous region 20, charge-blocking region 22, second amorphous region 24, and control gate material 26 may be formed in a process chamber separate from the chamber utilized for others of the materials and regions.

In some embodiments, the amorphous regions 20 and 24 may be deposited by ALD in order to obtain desired thickness and uniformity of the regions.

In some embodiments, charge-blocking region 22 may be formed by depositing one or more materials in an amorphous orientation, and then subjecting the materials to an anneal to convert them to a crystalline orientation. In such embodiments, amorphous region 24 may be formed after such anneal so that the region may fill grain boundaries occurring in the crystalline material, analogously to processing discussed below with reference to FIGS. 9-12.

In some embodiments, charge-retaining region 18 may be treated chemically or thermally to induce segregation within the region to create charge-trapping nanodots. Such segregation may create defects along a surface of the charge-trapping region. It may be desired that amorphous region 20 be formed after such defects have been created so that the material of the amorphous region can fill in the defects.

Referring to FIG. 7, gate stack 14 is patterned into a gate configuration. Such patterning can be accomplished utilizing any suitable methodology. In an example embodiment, the patterning may be accomplished by photolithographically forming a patterned mask (not shown) over gate stack 14, transferring a pattern from the mask into the gate stack with one or more suitable etches, and then removing the mask to leave the gate stack in the shown configuration.

Referring to FIG. 8, source/drain regions 28 are implanted into substrate 12 adjacent the gate configuration of gate stack 14 to complete formation of memory cell 15.

FIGS. 9-14 show an example method which may be utilized to form the memory cell 32 of FIG. 5. Similar numbering will be used to describe FIGS. 9-14 as is used above to describe FIG. 5, where appropriate.

Figure 9:
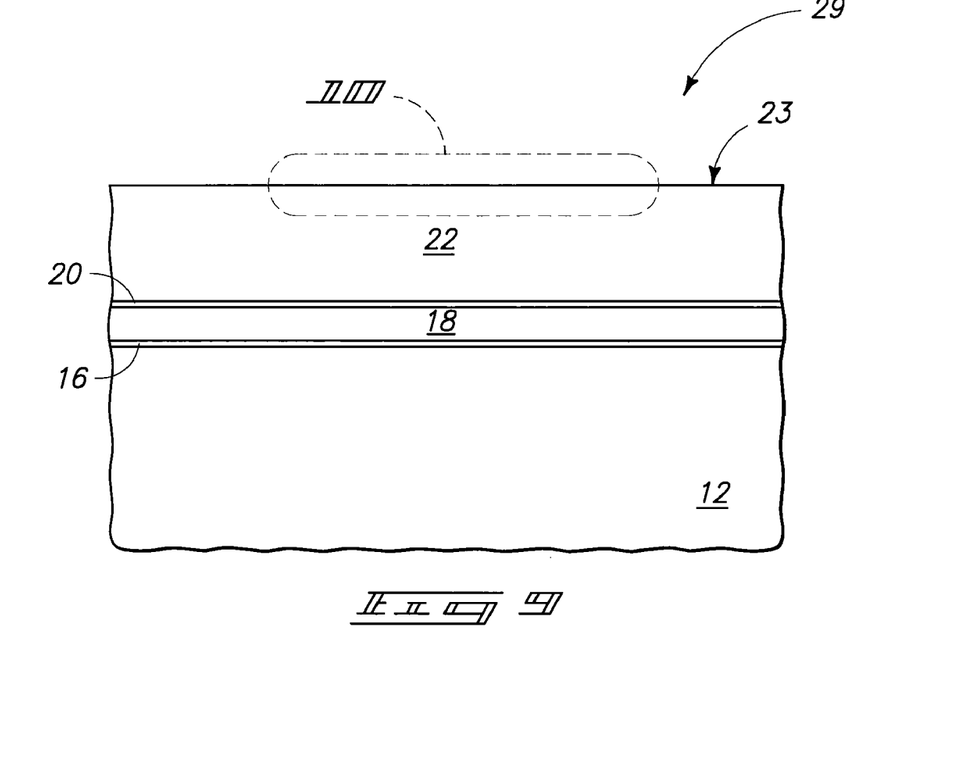
FIG. 9 is a diagrammatic, cross-sectional view of a portion of a semiconductor construction illustrating a process stage of an example embodiment method of forming a memory cell.

Referring to FIG. 9, semiconductor construction 29 is shown at a processing stage in which various regions and materials are formed to comprise layers extending across substrate 12. Specifically, the tunnel dielectric material 16, charge-retaining region 18, and charge-blocking region 22 are formed to extend across the substrate 12. The compositions of the regions and materials may be formed utilizing any suitable processing, including, for example, one or more of atomic layer deposition (ALD), chemical vapor deposition (CVD) and physical vapor deposition (PVD).

The charge-blocking region 22 comprises an upper surface 23. The charge-blocking region may be a single homogeneous material, or may comprise layers of multiple materials. Regardless, upper surface 23 may comprise, consist essentially of, or consist of ultra-high k dielectric material in crystalline form; such as, for example, one or more crystalline materials selected from the group consisting of HfO, ZrO, HfSiO, HfSiON, HfON, ZrON, ZrSiO and ZrSiON; where the chemical formulas indicate elements contained in the listed compositions rather than specific stoichiometries of the elements.

The crystalline ultra-high k dielectric material may be formed with any suitable processing. For instance, one or both of hafnium oxide and zirconium oxide may be deposited with ALD or CVD. The deposited material may be initially at least partially in an amorphous form. The material may then be subjected to an anneal at, for example, a temperature about 950° C. for time of about one minute to convert the material to a crystalline form. In subsequent processing, the material may be subjected to ozone treatment at about 350° C. for about 30 minutes to remove impurities that may have segregated to the grain boundaries.

Figure 10:
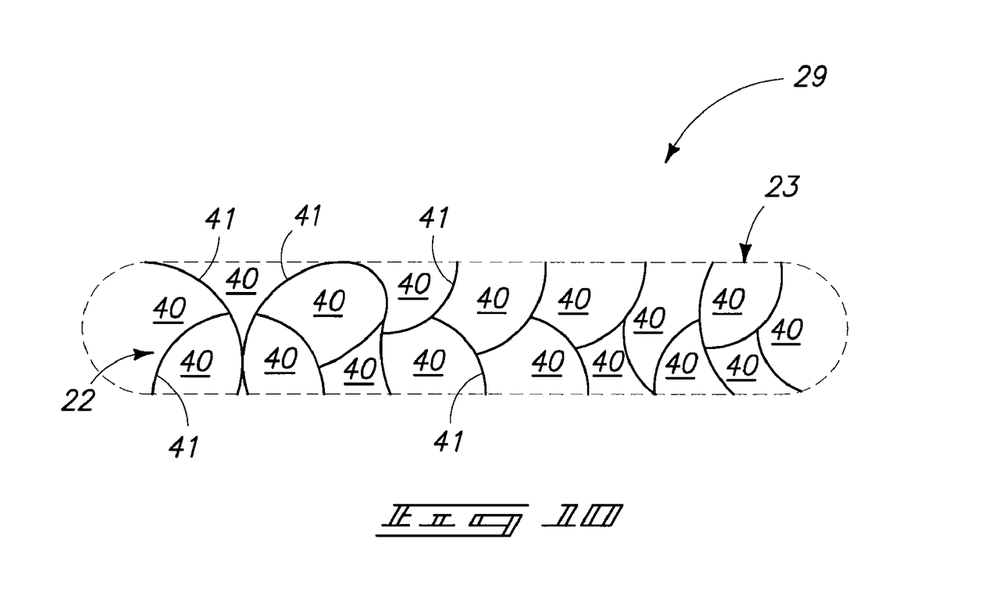
FIG. 10 is an expanded view of a region of the semiconductor construction of FIG. 9.

After the material is converted to a crystalline form, the surface 23 may have a number of grain boundaries extending therein. For instance, FIG. 10 diagrammatically illustrates an upper region of charge-blocking region 22, and shows the region to comprise individual crystalline grains 40 separated from one another by grain boundaries 41 (only some of which are labeled). The grain boundaries may provide leakage paths, and/or may provide an avenue for species to migrate from materials formed over charge-blocking region 22 (for instance, materials of the control gate material 26 shown in FIG. 5) into or through the charge-blocking region.

Figure 11:
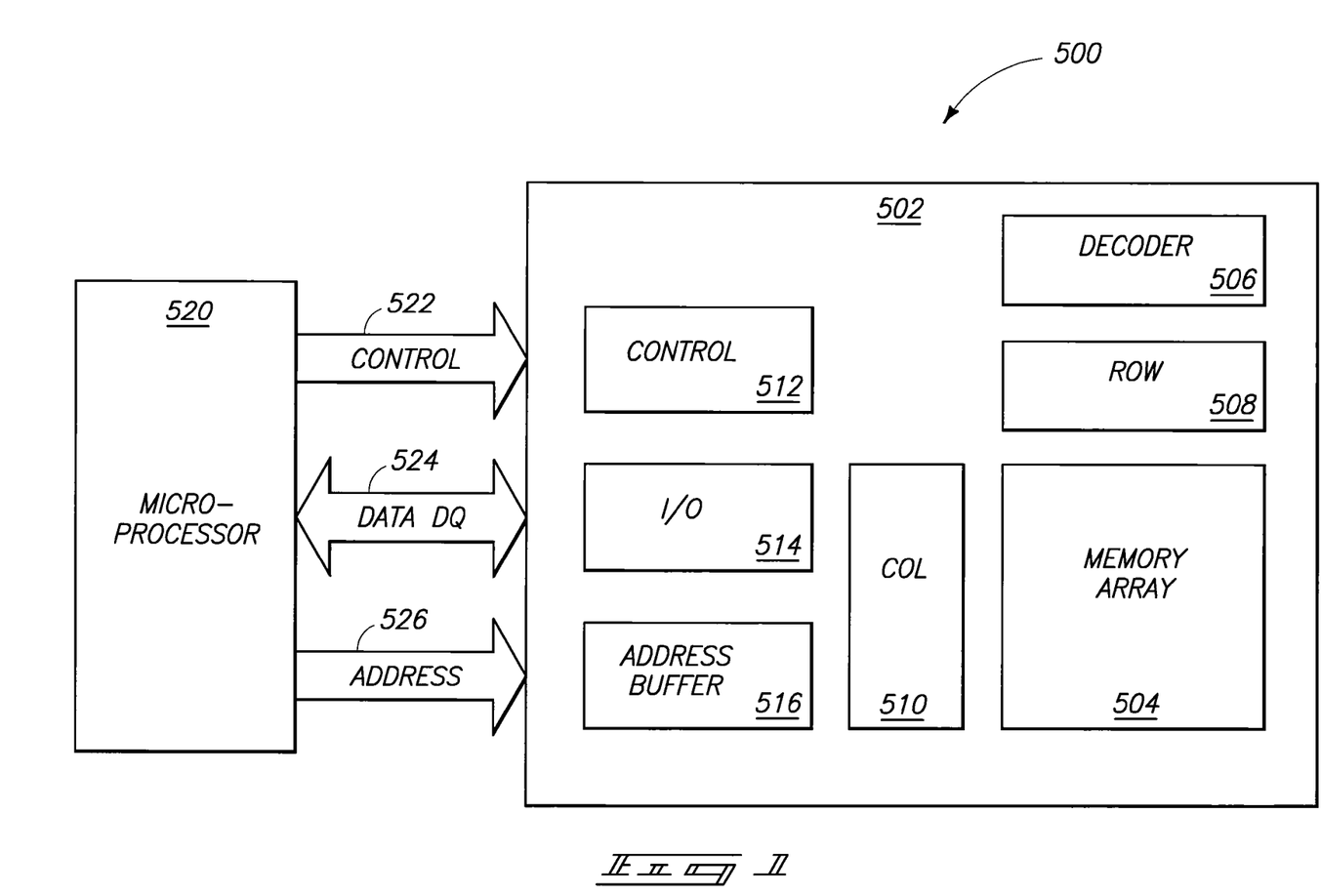
FIG. 11 is a diagrammatic, cross-sectional view of the portion of the semiconductor construction of FIG. 9, shown at a processing stage subsequent to that of FIG. 9.
Figure 12:
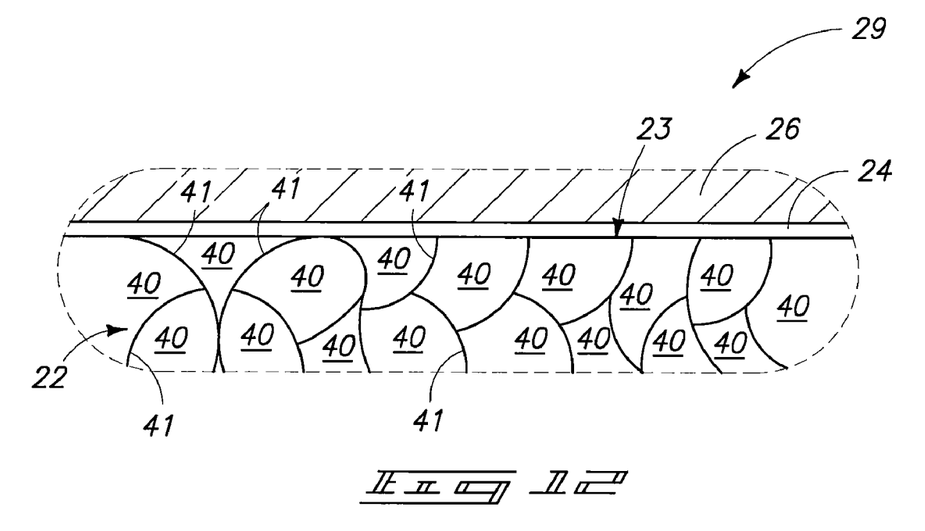
FIG. 12 is expanded view of a region of the semiconductor construction of FIG. 11.

Referring to FIG. 11, construction 29 is shown after formation of amorphous region 24 over upper surface 23, and after formation of control gate material 26 over the amorphous region 24. The amorphous region plugs the channels corresponding to grain boundaries 41 as shown in the expanded view of FIG. 12. The amorphous region thus precludes migration of species from control gate material 26, along the grain boundaries 41, and into charge-blocking region 22.

The amorphous region 24 may comprise, consist essentially of, or consist of one or more compositions selected from the group consisting of SiO, TiO, TaO, TaON, HfO, SiON, AlO, HfAlO, HfSiO, ZrO, ZrSiO, LaO, YO, LaAlO, ZrON, HfSiON, HfN, ZrN, AlN and TiON. The chemical formulas indicate elements contained in the listed compositions rather than specific stoichiometries of the elements.

The list of suitable materials for amorphous region 24 includes materials that may crystallize if subjected to an appropriate high-temperature anneal (for instance, hafnium oxide and zirconium oxide). If the materials utilized for the amorphous region include materials that may crystallize when subjected to a high-temperature anneal, the processing of FIGS. 9-12 can be used to accomplish the anneal of materials in the charge-blocking region 22 prior to deposition of the amorphous material. Such can avoid having thermally-induced crystallization of the amorphous material 24 occur during the anneal of the material of the charge-blocking region 22. Even if material is utilized for the amorphous region that does not crystallize when subjected to a high-temperature anneal, it can be advantageous to deposit the amorphous region after the anneal of the material of the charge-blocking region so that the material of the amorphous region can fill in gaps corresponding to grain boundaries along the surface 23 of the charge-blocking region 22. However, in some embodiments materials may be utilized for the amorphous region which do not crystallize when subjected to a high-temperature anneal, and it may be desired to deposit such materials prior to the anneal of the charge-blocking region to expedite a process flow sequence.

In some embodiments, the amorphous region 24 may be formed in the same reaction chamber as the tunnel dielectric material 16, charge-retaining region 18, and, charge-blocking region 22, and without breaking vacuum to the chamber. In such embodiments, the anneal may be conducted in such process chamber without breaking vacuum to the chamber. In other embodiments, the tunnel dielectric material 16, charge-retaining region 18, and charge-blocking region 22 may be formed in a reaction chamber, the anneal conducted in either the same reaction chamber or a different reaction chamber, and then the amorphous region 24 formed in a different reaction chamber from that utilized for forming the tunnel dielectric material, charge-retaining region and charge-blocking region.

Figure 13:
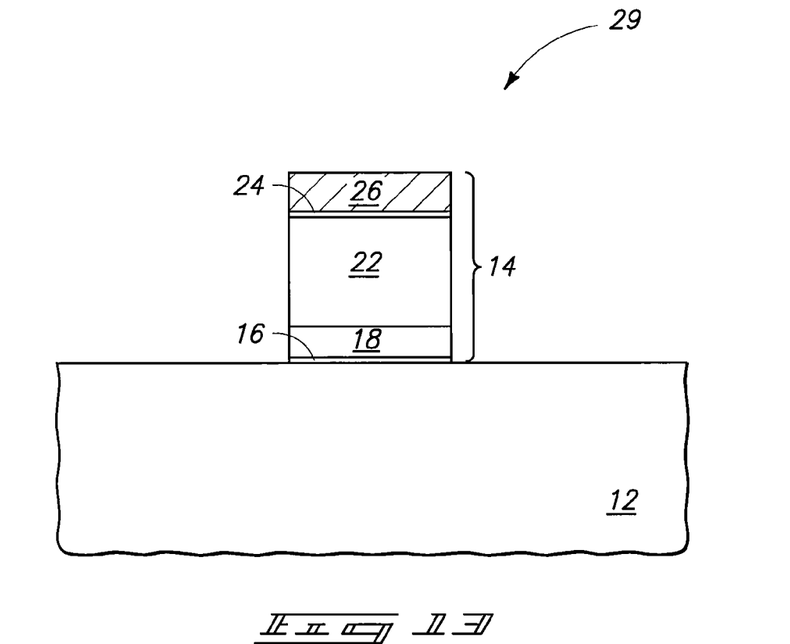
FIG. 13 is a diagrammatic, cross-sectional view of the portion of the semiconductor construction of FIG. 9, shown at a processing stage subsequent to that of FIG. 11.

The tunnel dielectric material 16, charge-retaining region 18, charge-blocking region 22, amorphous region 24 and control gate material 26 together form a gate stack 14. FIG. 13 shows construction 29 at a processing stage after the gate stack 14 has been patterned into a gate configuration. Such patterning can be accomplished utilizing any suitable methodology. In an example embodiment, the patterning may be accomplished by photolithographically forming a patterned mask (not shown) over gate stack 14, transferring a pattern from the mask into the gate stack with one or more suitable etches, and then removing the mask to leave the gate stack in the shown configuration.

Figure 14:
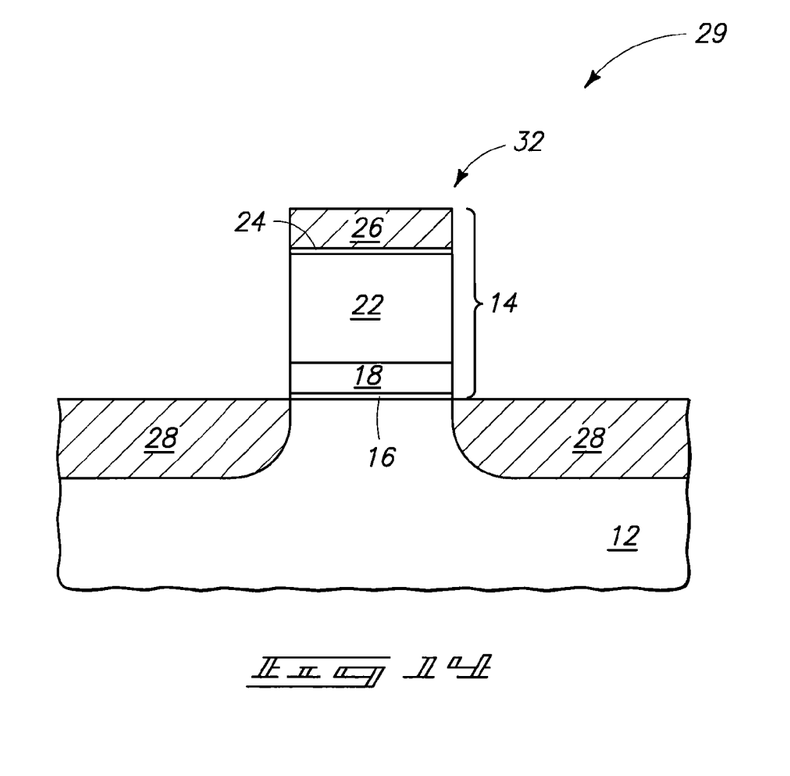
FIG. 14 is a diagrammatic, cross-sectional view of the portion of the semiconductor construction of FIG. 9, shown at a processing stage subsequent to that of FIG. 13.

Referring to FIG. 14, source/drain regions 28 are implanted into substrate 12 adjacent the gate configuration of gate stack 14 to complete formation of memory cell 32.

Figure 15:
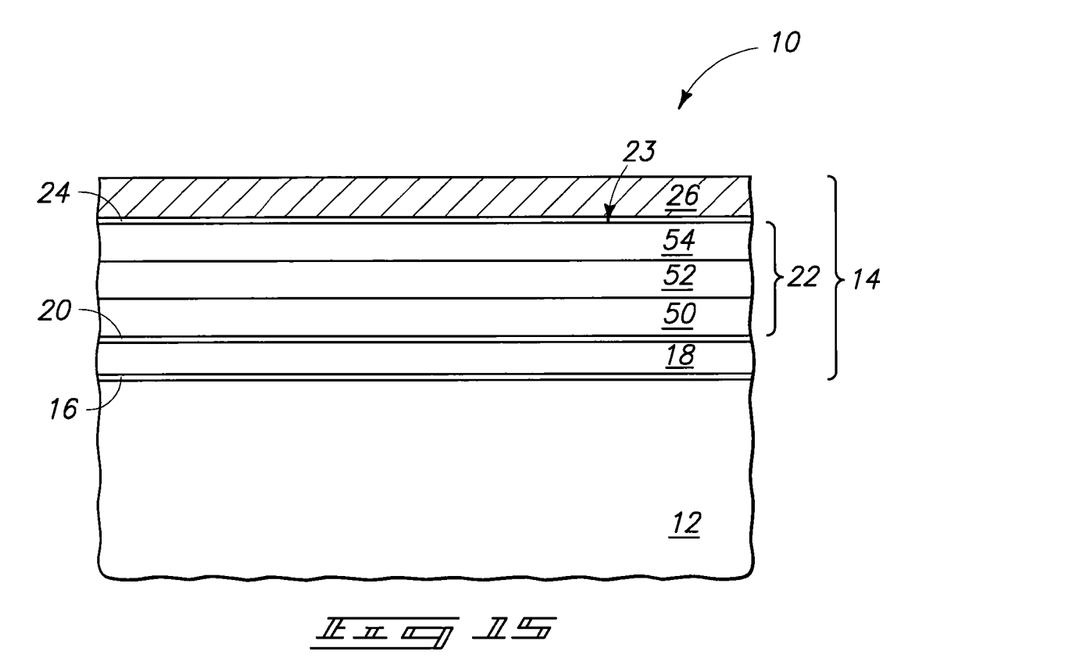
FIGS. 15 and 16 are diagrammatic, cross-sectional views of a portion of a semiconductor construction illustrating process stages of an example embodiment method of forming a memory cell.
Figure 16:
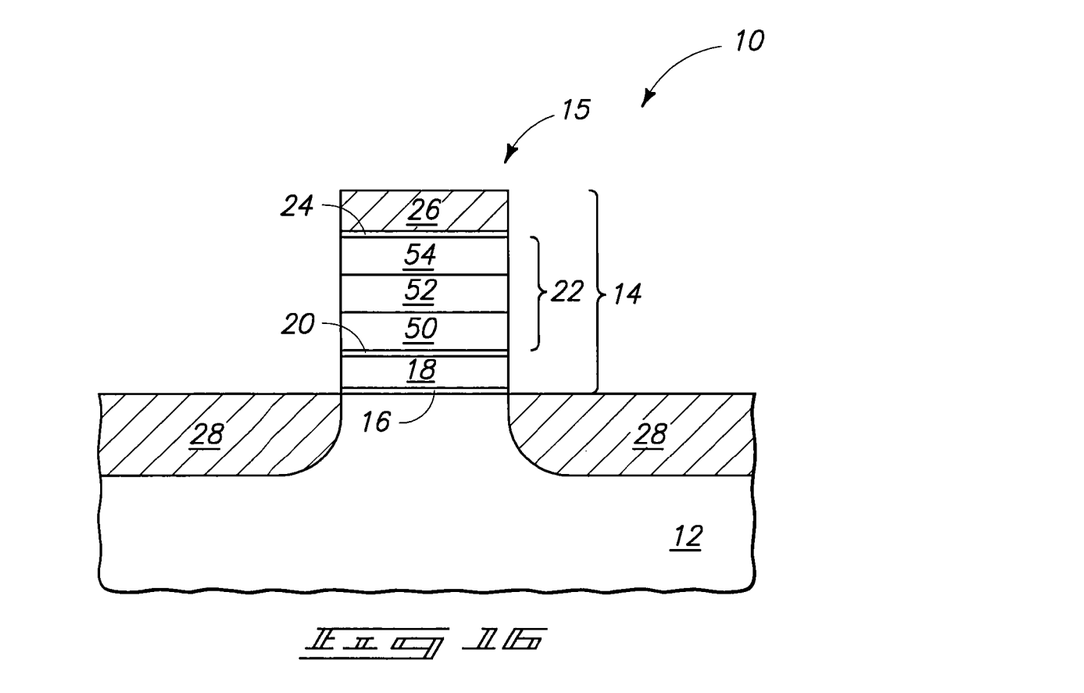

The various embodiments illustrated above in FIGS. 3-14 show charge-blocking region 22 as a single homogeneous material. During the discussion of the various embodiments, it is mentioned that the charge-blocking region may comprise multiple different materials stacked over one another. FIGS. 15 and 16 illustrate an example embodiment in which the charge-blocking region 22 comprises three materials 50, 52 and 54 that are stacked over one another. In other embodiments, there may be less than three materials stacked over one another, or more than three materials stacked over one another.

The embodiment of FIGS. 15 and 16 is shown relative to fabrication of a memory cell 15 analogous to the memory cell of FIG. 3. In other embodiments, processing analogous to that of FIGS. 15 and 16 may be utilized to fabricate the embodiments of FIGS. 4 and 5.

Referring to FIG. 15, a gate stack 14 is formed over substrate 12. The gate stack includes tunnel dielectric material 16, charge-retaining region 18, first amorphous region 20, charge-blocking region 22, second amorphous region 24, and control gate material 26.

The charge-blocking region 22 comprises the three materials 50, 52 and 54. Such materials may be of any suitable composition or combination of compositions. In some embodiments, at least the outer two materials 50 and 54 are ultra-high k dielectric materials. The materials 50 and 54 may be the same composition as one another, or may differ in composition relative to one another. In some embodiments, materials 50 and 54 both comprise, consist essentially of, or consist of one or more crystalline materials selected from the group consisting of HfO, ZrO, HfSiO, HfSiON, HfON, ZrON, ZrSiO and ZrSiON; where the chemical formulas indicate elements contained in the listed compositions rather than specific stoichiometries of the elements; and material 52 consists of a dielectric material different from the composition of materials 50 and 54. In such embodiments, material 52 may be a substantially low k dielectric material (i.e., may have a dielectric constant less than or equal to 7), an intermediate k dielectric material (i.e., may have a dielectric constant greater than 7 and less than or equal to 12), a high k dielectric material (i.e., may have a dielectric constant greater than 12), or an ultra-high k dielectric material (i.e., may have a dielectric constant greater than or equal to 15). The material 52 may be amorphous or crystalline.

Amorphous materials 20 and 24 may be materials inert relative to reaction with materials 50 and 54 at temperatures of less than or equal to 1100° C. In some embodiments, materials 50 and 54 consist of hafnium oxide and/or zirconium oxide, and materials 20 and 24 consist of aluminum oxide.

Referring to FIG. 16, gate stack 14 is patterned into a gate configuration, and source/drain regions 28 are implanted into substrate 12 adjacent the gate configuration of gate stack 14 to complete formation of memory cell 15.

The embodiments discussed above may be utilized in electronic systems, such as, for example, computers, cars, airplanes, clocks, cellular phones, etc.

Figure 17:
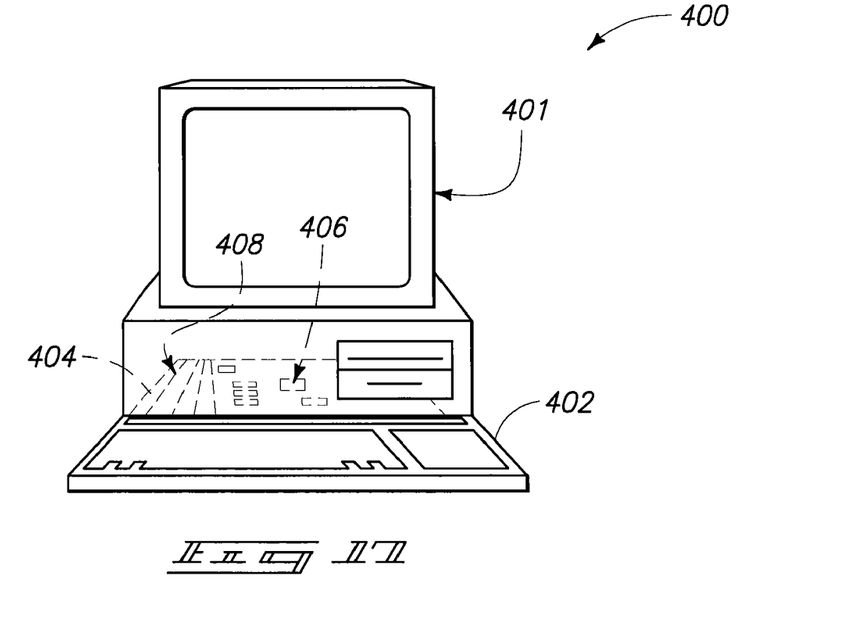
FIG. 17 is a diagrammatic view of a computer embodiment.
Figure 18:
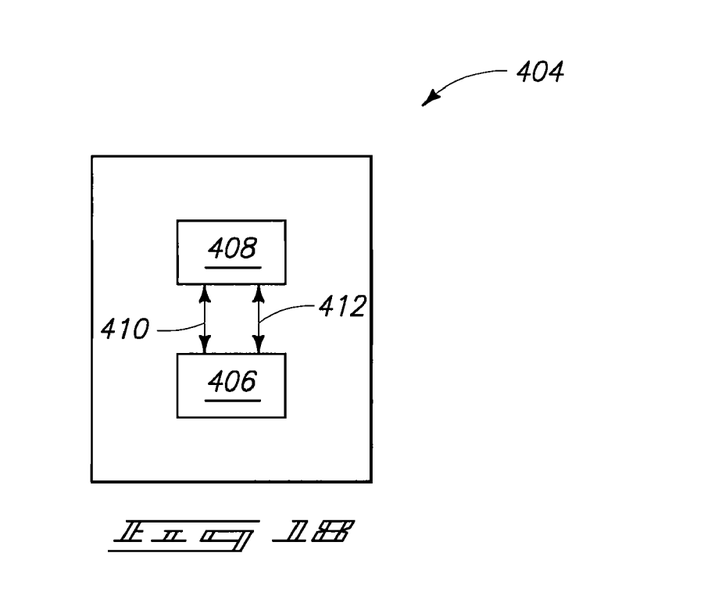
FIG. 18 is a block diagram showing particular features of the motherboard of the FIG. 17 computer embodiment.

FIG. 17 illustrates an embodiment of a computer system 400. Computer system 400 includes a monitor 401 or other communication output device, a keyboard 402 or other communication input device, and a motherboard 404. Motherboard 404 may carry a microprocessor 406 or other data processing unit, and at least one memory device 408. Memory device 408 may comprise an array of memory cells, and such array may be coupled with addressing circuitry for accessing individual memory cells in the array. Further, the memory cell array may be coupled to a read circuit for reading data from the memory cells. The addressing and read circuitry may be utilized for conveying information between memory device 408 and processor 406. Such is illustrated in the block diagram of the motherboard 404 shown in FIG. 18. In such block diagram, the addressing circuitry is illustrated as 410 and the read circuitry is illustrated as 412.

Processor device 406 may correspond to a processor module, and associated memory utilized with the module may comprise flash structures.

Memory device 408 may correspond to a memory module, and may comprise flash memory.

Figure 19:
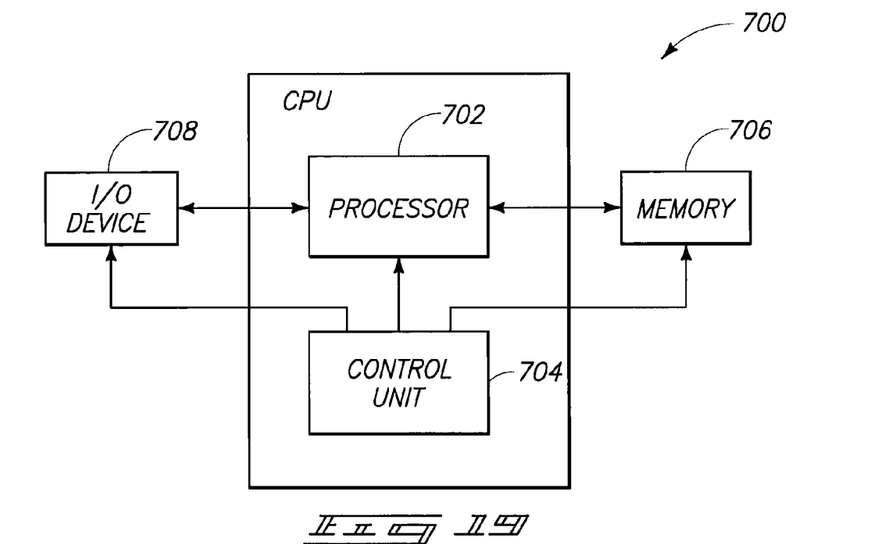
FIG. 19 is a high level block diagram of an electronic system embodiment.

FIG. 19 illustrates a simplified block diagram of a high-level organization of an electronic system 700. System 700 may correspond to, for example, a computer system, a process control system, or any other system that employs a processor and associated memory. Electronic system 700 has functional elements, including a processor 702, a control unit 704, a memory device unit 706 and an input/output (1/0) device 708 (it is to be understood that the system may have a plurality of processors, control units, memory device units and/or I/O devices in various embodiments). Generally, electronic system 700 will have a native set of instructions that specify operations to be performed on data by the processor 702 and other interactions between the processor 702, the memory device unit 706 and the I/O device 708. The control unit 704 coordinates all operations of the processor 702, the memory device 706 and the I/O device 708 by continuously cycling through a set of operations that cause instructions to be fetched from the memory device 706 and executed. The memory device 706 may include flash memory, such as a flash card.

Figure 20:
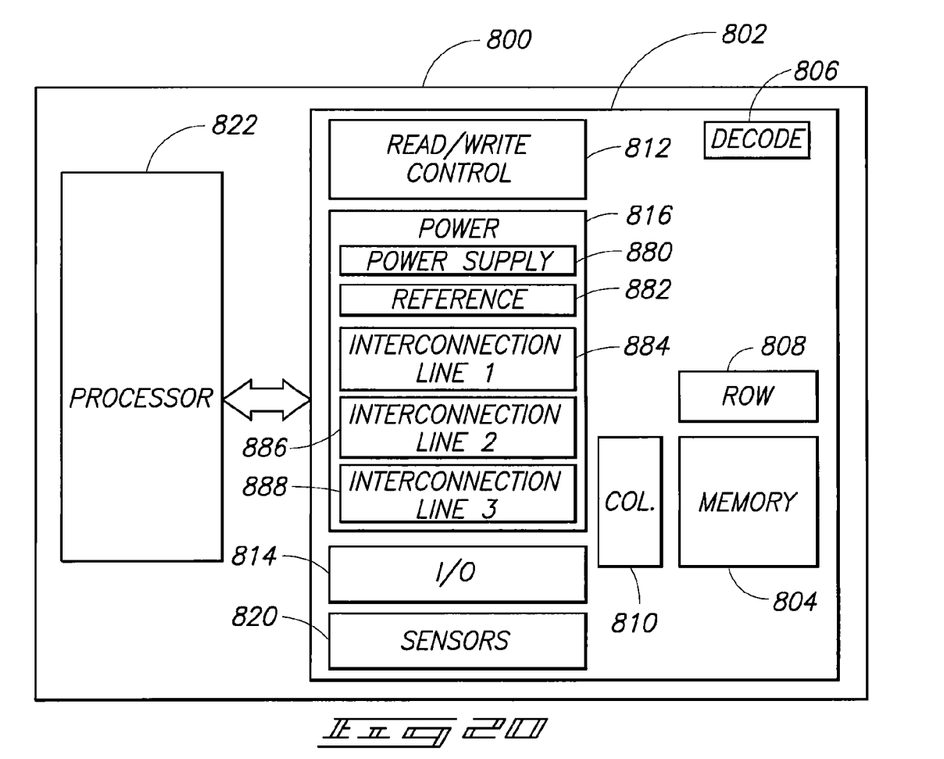
FIG. 20 is a simplified block diagram of a memory device embodiment.

FIG. 20 is a simplified block diagram of an electronic system 800. The system 800 includes a memory device 802 that has an array of memory cells 804, address decoder 806, row access circuitry 808, column access circuitry 810, read/write control circuitry 812 for controlling operations, and input/output circuitry 814. The memory device 802 further includes power circuitry 816, and sensors 820, such as current sensors for determining whether a memory cell is in a low-threshold conducting state or in a high-threshold non-conducting state. The illustrated power circuitry 816 includes power supply circuitry 880, circuitry 882 for providing a reference voltage, circuitry 884 for providing a first interconnection line (for instance, a wordline) with pulses, circuitry 886 for providing a second interconnection line (for instance, another wordline) with pulses, and circuitry 888 for providing a third interconnection line (for instance, a bitline) with pulses. The system 800 also includes a processor 822, or memory controller for memory accessing.

The memory device 802 receives control signals from the processor 822 over wiring or metallization lines. The memory device 802 is used to store data which is accessed via I/O lines. At least one of the processor 822 or memory device 802 may include flash memory.

The various electronic systems may be fabricated in single-package processing units, or even on a single semiconductor chip, in order to reduce the communication time between the processor and the memory device(s).

The electronic systems may be used in memory modules, device drivers, power modules, communication modems, processor modules, and application-specific modules, and may include multilayer, multichip modules.

The electronic systems may be any of a broad range of systems, such as clocks, televisions, cell phones, personal computers, automobiles, industrial control systems, aircraft, etc.

Although many of the embodiments described above pertain to nonvolatile memory cells, in other embodiments amorphous layers adjacent crystalline ultra-high k dielectric material could be utilized in other structures. For instance, the amorphous layers adjacent crystalline ultra-high k dielectric material could be utilized in gate dielectric of field effect transistors. Such field effect transistors could be incorporated into integrated circuitry, and may, for example, be incorporated into dynamic random access memory (DRAM) devices.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming a memory cell, comprising:
forming a tunnel dielectric material over a semiconductor substrate;
forming a charge-retaining region over the tunnel dielectric material;
forming one or more crystalline ultra-high k dielectric materials over the charge-retaining region;
forming an amorphous region over the crystalline ultra-high k dielectric materials, and
forming a control gate material over the amorphous region.

2. The method of claim 1 wherein:
at least one of the crystalline ultra-high k dielectric materials is formed by initially depositing an amorphous starting material and then subjecting the starting material to an anneal to convert the amorphous starting material into the crystalline ultra-high k dielectric material; and
the amorphous region is formed after said anneal.

3. The method of claim 1 wherein one side of the amorphous region is directly adjacent a composition of the control gate material, and another side of the amorphous region is directly adjacent one of the crystalline ultra-high k dielectric materials; and wherein the amorphous region is non-reactive with both the crystalline ultra-high k dielectric material and the composition of the control gate material at temperatures of less than or equal to about 1100° C.

4. The method of claim 3 wherein said one of the crystalline ultra-high k dielectric materials consists of hafnium oxide, and wherein the amorphous region consists of aluminum oxide.

5. The method of claim 1 wherein the amorphous region has a thickness of less than or equal to about 30 Å.

6. The method of claim 1 wherein the amorphous region comprises one or more compositions selected from the group consisting of HfO, SiON, AlO, HfAlO, HfSiO, ZrO, ZrSiO, LaO, YO, LaAlO, ZrON, HfSiON, HfN, ZrN, AlN and TiON; where the chemical formulas indicate elements contained in the listed compositions rather than specific stoichiometries of the elements.

7. The method of claim 1 wherein the amorphous region is a second amorphous region, and further comprising:
forming a first amorphous region over the charge-retaining region; and
forming the one or more crystalline ultra-high k dielectric materials over the first amorphous region.

8. The method of claim 7 wherein the first amorphous region has a thickness of less than or equal to about 30 Å.

9. The method of claim 7 wherein the first and second amorphous regions are the same composition as one another.

10. The method of claim 9 wherein the first and second amorphous regions both consist of $Al_2O_3$.

11. The method of claim 7 wherein the first and second amorphous regions are different in composition from one another.

12. A memory cell comprising:
a tunnel dielectric material;
a charge-retaining region over the tunnel dielectric material;
one or more crystalline ultra-high k dielectric materials over the charge-retaining region;
an amorphous region over the one or more crystalline ultra-high k dielectric materials; and
a control gate material over the amorphous region.

13. The memory cell of claim 12 wherein the amorphous region comprises one or more compositions selected from the group consisting of HfO, SiON, AlO, HfAlO, HfSiO, ZrO, ZrSiO, LaO, YO, LaAlO, ZrON, HfSiON, HfN, ZrN, AlN and TiON; where the chemical formulas indicate elements contained in the listed compositions rather than specific stoichiometries of the elements.

14. The memory cell of claim 12 wherein the amorphous region consists of aluminum oxide, and has a thickness of less than or equal to about 30 Å; and wherein the one or more crystalline ultra-high k dielectric materials include hafnium oxide directly against the aluminum oxide.

* * * * *